United States Patent
Aisenbrey (10) Patent No.: US 7,268,479 B2
(45) Date of Patent: Sep. 11, 2007

(54) LOW COST LIGHTING CIRCUITS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 332 days.

(21) Appl. No.: 10/819,809

(22) Filed: Apr. 7, 2004

(65) Prior Publication Data

US 2004/0189170 A1    Sep. 30, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,773, filed on Jun. 16, 2003, provisional application No. 60/462,073, filed on Apr. 14, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01J 29/10* (2006.01)

(52) U.S. Cl. .................................... 313/475

(58) Field of Classification Search .......... 315/111.01, 315/111.11, 87; 313/475, 281, 282, 311
See application file for complete search history.

(56) References Cited

U.S. PATENT DOCUMENTS 4,841,099 A    6/1989    Epstein et al. ............. 174/68.5

(Continued)

FOREIGN PATENT DOCUMENTS

GB    2 377449 A    1/2003

OTHER PUBLICATIONS

"Nanocomposite Materials Offer Higher Conductivity and Flexibility", McCluskey, et al. Proc. 3rd Int'l Conf. on Adhesive Joining and Coating Tech. in Electron. Manuf., 1998, pp. 282-286.

(Continued)

*Primary Examiner*—Shih-Chao Chen
*Assistant Examiner*—Minh Dieu A
(74) *Attorney, Agent, or Firm*—Douglas R. Schnabel (57) ABSTRACT

Lighting devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

35 Claims, 9 Drawing Sheets

U.S. PATENT DOCUMENTS

| | | | |
|---|---|---|---|
| 5,685,632 A | 11/1997 | Schaller et al. | 362/205 |
| 5,771,027 A | 6/1998 | Marks et al. | 343/912 |
| 6,054,716 A * | 4/2000 | Sonobe et al. | 250/552 |
| 6,138,348 A | 10/2000 | Kulesza et al. | 29/840 |
| 6,249,261 B1 | 6/2001 | Solberg, Jr. et al. | 343/801 |
| 6,602,446 B2 | 8/2003 | Ushijima | 252/512 |
| 6,613,247 B1 * | 9/2003 | Hohn et al. | 252/301.36 |
| 6,806,583 B2 * | 10/2004 | Koay et al. | 257/787 |
| 6,861,677 B2 * | 3/2005 | Chen | 257/99 |
| 6,949,772 B2 * | 9/2005 | Shimizu et al. | 257/99 |

OTHER PUBLICATIONS

"Fundamental Understanding of Conductivity Establishment for Electrically Conductive Adhesives," Kianhua et al., Proc. of 52nd Electron. Comp. & Tech. Conf., 2002, pp. 1154-1157.

"Advanced Packaging and Substrate Technology Using Conductive Adhesives," Eda, Proc. 3rd Int'l Conf. on Adhesive Joining and Coating Tech. in Electron. Manuf., 1998, pp. 144-151.

"Design and Understanding of Anisotropic Conductive Films (Aefs) for LCD Packaging," Yim et al., The First IEEE Int'l Symp. on Polymeric Electron. Pckging, 1997, pp. 233-242.

* cited by examiner

LOW COST LIGHTING CIRCUITS MANUFACTURED FROM CONDUCTIVE LOADED RESIN-BASED MATERIALS

This Patent Application claims priority to the U.S. Provisional Patent Application 60/462,073 filed on Apr. 14, 2003, and to the U.S. Provisional Patent Application 60/478,773, filed on Jun. 16, 2003, which are herein incorporated by reference in their entirety.

This Patent Application is a Continuation-in-Part of U.S. patent application Ser. No. 10/309,429, filed on Dec. 4, 2002, U.S. Pat. No. 6,870,516 also incorporated by reference in its entirety, which is a Continuation-in-Part application of U.S. patent application Ser. No. 10/075,778, filed on Feb. 14, 2002 now U.S. Pat. No. 6,741,221 which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to lighting circuits and, more particularly, to LED lighting circuits including conductors and heat sinks molded of conductive loaded resin-based materials comprising micron conductive powders, micron conductive fibers, or a combination thereof, homogenized within a base resin when molded.

(2) Description of the Prior Art

Lighting sources are used in a large variety of applications to provide indication and illumination. Lighting indication, or indicator lighting, is light used to deliver a message. Indicator lighting is widely used in signs, streetlights, automobiles, appliances, machinery, computers, entertainment devices, electronics, and the like. Automobile brake lights and computer 'ON' LED lights are examples of indicator lighting. Lighting illumination, or illuminating lighting, is used to provide, or to enhance, lighting for human activity. Illumination lighting is widely used in homes, offices, factories, schools, institutions, automobiles, and the like. Automobile headlights and office fluorescent lighting are examples illumination lighting.

Most modern lighting sources are powered by electricity. Electrically powered lights may be generally categorized as incandescent, gas/fluorescent, and solid state. Incandescent lights, such as common light bulbs, rely on an incandescing filament, such as tungsten wire, to generate light. Unfortunately, much of the electrically energy is converted into infrared radiation (heat) that is not detectable to the unaided human eye. Gas/fluorescent lights, such as neon lights, mercury vapor lamps, halogens lamps, and the like, rely on gas discharge phenomenon to generate light. Fluorescent bulbs can be substantially more efficient than incandescent bulbs in converting electrical energy into useful light energy. However, fluorescent bulbs may require relatively sophisticates starter and ballast circuits and frequently contain poisonous mercury.

Solid state lights, such as light emitting diodes (LED's), rely on the emission of photons (light energy) produced as electrons drop from conduction energy bands to lower orbital bands. Diodes are formed by bringing two slightly different materials together to form a PN junction. Typical PN junctions are formed from a semiconductor material such as silicon or aluminim-gallium-arsenide (AlGaAs) or the like. Pure, crystalline forms of these materials are poor conductors. However, the introduction of selected doping ions will make these materials conductive by creating extra electrons (n-type) or extra holes (p-type). When an n-type and a p-type material are put together, a PN junction, or PN diode is formed.

Under non-breakdown conditions, current (electrons) only flows in one direction in the diode—from N to P—under a positive voltage from P to N. The positive voltage provides energy for free electrons in the N region to jump from a lower orbital into a conduction orbital. These electrons then are able to move from the N region, across a central depletion region, and into the P region. Once in the P region, the electrons fall into empty hole locations and, as a result, drop from the conduction band into a lower orbital. This orbital drop results in the emission of a photon. All diodes release photon energy, however, only those which release energy in the spectrum of visible light are commonly called light emitting. To achieve a visible light photon emission, the energy gap between the conduction band and the lower orbitals must be wide. The width of this energy gap determines the wavelength of the photon and, therefore, the color of the emitted light.

LED devices convert part of the input electrical energy into visible light and part of this electrical energy into heat. The diode device is typically housed in a plastic lens. The photons emitted by the diode are omni-directional. However, the lens concentrates the light, using reflection, such that the light emitted from the top of the lens is substantially unidirectional and intense. LED devices are far more efficient than incandescent lights and more versatile than gas/fluorescent lights. LED devices generate little heat, though the heat that is generated is an important consideration in LED applications as will be described below. LED devices are in widespread use for indicators due to their low power consumption and multitude of colors. However, recent price reductions in semiconductor devices and the development of high intensity LED devices producing "white" light have resulted in more frequent use of LED devices for illumination applications. High intensity LED devices are now used as single lights, in applications such as flashlights, and as rows or arrays of lights, in applications such as taillights, traffic lights, flood lights, and signs.

Though LED devices are relatively simple, two terminal semiconductor devices, there are several considerations in designing and manufacturing LED lighting circuits. First, beyond the turn-ON voltage, the current response of the diode is exponential. Therefore, to prevent over-current damage to the diode, resistance must be placed in the circuit path. Typically, the resistance is placed in the path between the power supply and the anode (+) connection to the P side of the device while the cathode (−) connection to the N side is connected to ground. This resistance value is typically implemented as a discrete resistor that is either inserted or surface mounted onto the LED circuit board.

Second, although the LED generates less heat than an incandescent light, the heat that is generated in the junction is significant for several reasons. First, the performance of the LED is closely related to the junction temperature ($T_{junction}$) of the device. It is found that the wavelength, or color, of light emitted from the LED varies with $T_{junction}$. Therefore, a diode that is specifically designed for a color application, such as in a video array, may perform inaccurately at increased temperatures. It is found that the intensity (lumens) of light generated by an LED decreases with increasing temperature. This is especially significant since it may be tempting for the circuit designer or operator to increase current to maintain output intensity in an LED that is lagging due to high $T_{junction}$. This can be counter productive and even result in damaging the LED since further increases in current also increase $T_{junction}$. Unlike incandescent bulbs, LED devices do not have a distinctive wear-out mechanism to compare to filament breakage. Rather, it is found that the light intensity output of the device simply decreases over time. It is further found that high temperature operation shortens the time needed for degradation to occur. Based on all of the above observations, it is found that heat removal mechanisms, such as heat sinks, are very useful and/or necessary parts of LED-based lighting devices and, especially, those lighting devices using high output LED devices for illumination applications. However, in the prior art, heat sink structures typically comprise discrete, metal structures that must be manufactured and placed onto the LED circuit board. Further, resistors in LED lighting circuits are typically discrete devices that are mechanically placed on the lighting circuit. Each of these prior art approaches is found to increase the part count, the tooling costs, the assembly complexity, and the manufacturing costs of LED lighting systems.

Several prior art inventions relate to alternative electrical conductors and lighting systems. U.S. Pat. No. 5,685,632 Schaller, et al provides a light source such as battery-powered flashlights and lanterns, taillight assemblies of automobiles or motorcycles, battery housings, or head assemblies for light sources are formed from electrically conductive plastic. U.S. Pat. No. 5,771,027 to Marks, et al describes a composite antenna with a grid comprised of electrical conductors woven into the warp of a resin reinforced cloth forming one layer of the multi-layer laminate structure of the antenna. U.S. Pat. No. 6,249,261 Solberg, Jr., et al details a direction-finding antenna constructed from polymer composite materials that are electrically conductive. The polymer composite materials replace traditional metal materials. U.S. Pat. No. 6,138,348 Kulesza, et al presents a method for forming a bumped substrate and an electrical circuit that includes the bumped substrate. The method of forming the bumped substrate includes forming at least one electrically conductive polymer bump on each of a first set of bond pads of the substrate. At least one electrically conductive polymer bump is then formed on each of a second set of the bond pads of the substrate. U.S. Pat. No. 4,841,099 Epstein et al teaches an electrical component made from an electrically insulating polymer matrix filled with electrically insulating fibrous filler which is capable of heat conversion to electrically conducting fibrous filler and has at least one continuous electrically conductive path formed in the matrix by the in situ heat conversion of the electrically insulating fibrous filler.

Nv Bekaert sa of Kortrijk, Belgium is a manufacturer of metal yarns, knitted metal fabric, chopped metal fibers and pellets, and sintered porous media. The fibers are marketed with diameters of from 1 mm to 20 mm and may be chopped into fiber pieces or be of continuous yarns. The metals shown in the product description found www.bekaert.com Jan. 25, 2003 are stainless steel, temperature resistant alloys, nickel and nickel alloys, titanium, aluminum, and copper. "Fundamental Understanding of Conductivity Establishment for Electrically Conductive Adhesives," Fan et al., Proceedings of the 52nd Electronic Components and Technology Conference, 2002, pp: 1154-1157, describes several epoxy resin based curing systems that were used as the matrices for isotropically conductive adhesives (ICAs). The ICAs exhibited different curing peak temperatures. This enables the investigation of the effects of the curing process upon the resultant bulk resistivity of the ICAs. The experimental results indicated a strong correlation between bulk resistivity and curing temperature or curing kinetics. "Advanced Packaging and Substrate Technology Using Conductive Adhesives," Eda, Proceedings of 3rd International Conference on Adhesive Joining and Coating Technology in Electronics Manufacturing, 1998. pp: 144-151, discusses packaging and substrate technologies using conductive adhesives, stud bump bonding (SBB) and ALIVH (any layer inner via hole) high density wiring board. "Design And Understanding of Anisotropic Conductive Films (Acfs) for LCD Packaging," Yim, et al., The First IEEE International Symposium on Polymeric Electronics Packaging, 1997, pp: 233-242, describes anisotropic conductive films (ACF) composed of an adhesive resin and fine conductive fillers such as metallic particles or metal-coated polymer balls. These resins and fillers are key materials for fine pitch chip-on-film (COF) and chip-on-glass (COG) LCD packaging. "Nanocomposite Materials Offer Higher Conductivity and Flexibility", McCluskey, et al., Proceedings of 3rd International Conference on Adhesive Joining and Coating Technology in Electronics Manufacturing, 1998, pp: 282-286, describes the mechanical and electrical characteristics of a conductive polymer made with conductive silver flake nanoparticle fillers. The use of nanoparticle fillers allows the material to attain the same level of conductivity exhibited by traditional filled polymers at significantly lower particle loading. The conductive polymer combines the high conductivity and stability of a filled polymer with the flexibility and low density of an intrinsically conductive polymer.

SUMMARY OF THE INVENTION

A principal object of the present invention is to provide an effective lighting circuit.

A further object of the present invention is to provide a method to form a lighting circuit;

A further object of the present invention is to provide a lighting circuit molded of conductive loaded resin-based materials.

A yet further object of the present invention is to provide conductive structures of conductive loaded resin-based materials to supply electrical power to lights in the lighting circuit.

A yet further object of the present invention is to provide conductive structures of conductive loaded resin-based materials where the conductive structures also provide heat sink functionality to thereby eliminate discrete heat sink devices.

A yet further object of the present invention is to provide conductive structures of conductive loaded resin-based materials to supply electrical power to lights in the lighting circuit where the conductive structures also provide resistive current damping to thereby eliminate discrete resistors.

A yet further object of the present invention is to provide a lighting circuit molded of conductive loaded resin-based material where the electrical and/or thermal characteristics can be altered, the visual characteristics can be altered, and/or the properties of the original surface can be altered to make it more suitable for a designated task by forming a metal layer over the conductive loaded resin-based material.

A yet further object of the present invention is to provide methods to fabricate a lighting circuit from a conductive loaded resin-based material incorporating various forms of the material.

A yet further object of the present invention is to provide a lighting circuit molded of conductive loaded resin-based material where performance characteristics can be altered or the visual characteristics can be altered through selection of the base resin.

A yet further object of the present invention is to provide a lighting circuit optimized for an LED lighting source.

A yet further object of the present invention is to provide an LED device with a built-in heat sink comprising a conductive loaded resin-based material.

In accordance with the objects of this invention, a lighting device is achieved. The lighting device comprises a light having electrical terminals and conductive structures connected to the electrical terminals to supply electrical energy to the light. The conductive structures comprise a conductive loaded, resin-based material comprising conductive materials in a base resin host.

Also in accordance with the objects of this invention, a lighting device is achieved. The lighting device comprises a light emitting diode having cathode and anode terminals and conductive structures connected to the cathode and anode terminals to supply electrical energy to the light. The conductive structures comprise a conductive loaded, resin-based material comprising conductive materials in a base resin host. At least one conductive structure additionally provides resistive current damping for the light emitting diode. At least one conductive structure additionally provides a heat sink function to dissipate heat from the light emitting diode.

Also in accordance with the objects of this invention, a method to form a lighting device is achieved. The method comprises providing a light having electrical terminals. A conductive loaded, resin-based material comprising conductive materials in a resin-based host is provided. The conductive loaded, resin-based material is molded into conductive structures. The light electrical terminals are connected to the conductive structures to supply electrical energy to the light.

Also in accordance with the objects of this invention, a composite light emitting diode device is achieved. The device comprises a light emitting diode, an encapsulating package, and a heat sink. The light emitting diode is thermally connected to the heat sink. The heat sink comprises a conductive loaded, resin-based material comprising conductive materials in a base resin host. The light emitting diode is encapsulated by in the encapsulating package and the heat sink. The heat sink protrudes out of the encapsulating package.

BRIEF DESCRIPTION OF THE DRAWINGS

In the accompanying drawings forming a material part of this description, there is shown.

DESCRIPTION OF THE PREFERRED EMBODIMENTS

This invention relates to lighting circuits molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of lighting circuits fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the lighting circuit device are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of lighting circuits significantly lowers the cost of materials and the design and manufacturing processes used to hold ease of close tolerances, by forming these materials into desired shapes and sizes. The lighting circuits can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the lighting circuits and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming lighting circuits that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in lighting applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, lighting circuits manufactured from the molded conductor loaded resin-based material can provide added thermal dissipation capabilities to the application. For example, heat can be dissipated from electrical devices physically and/or electrically connected to the present invention.

Figure 1:
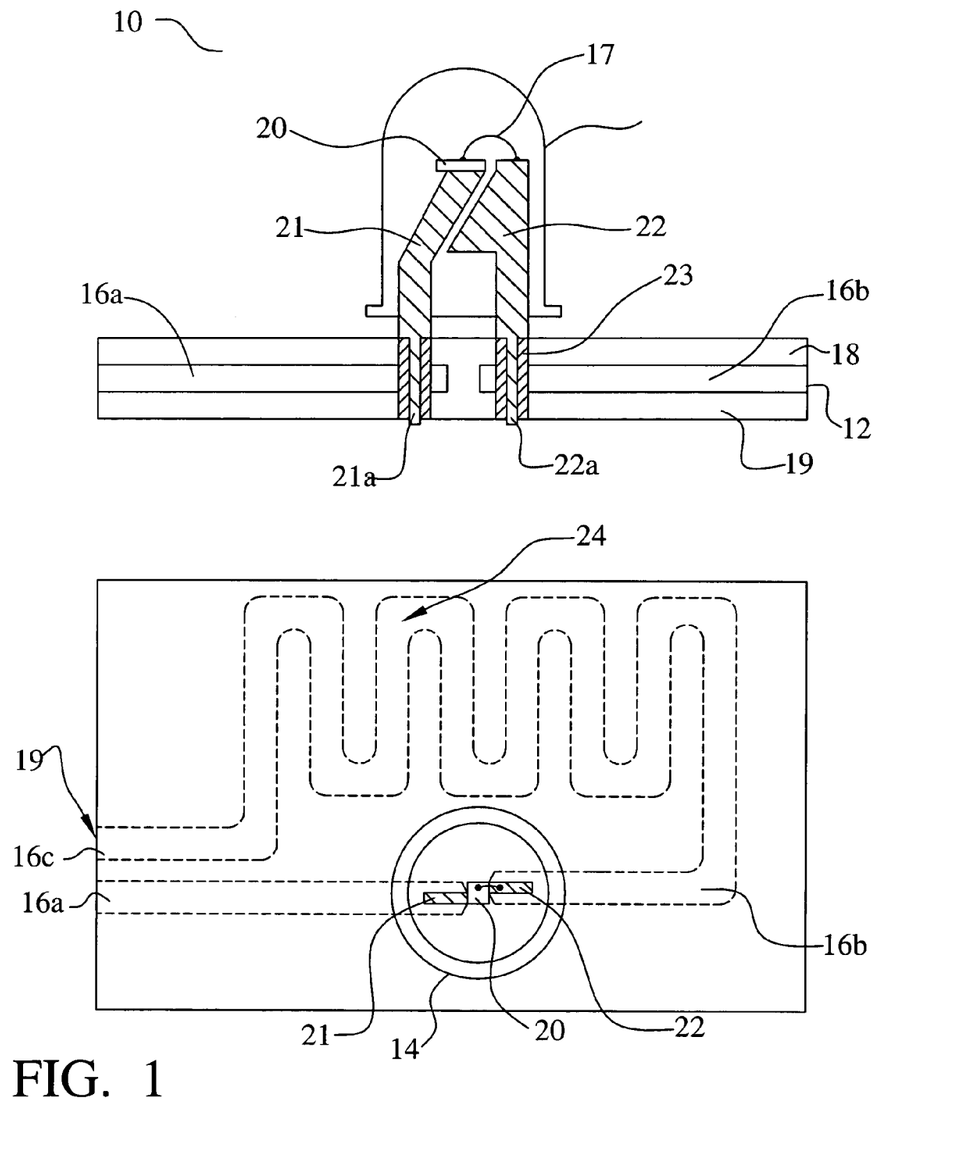
FIG. 1 illustrates a first preferred embodiment of the present invention showing a light emitting diode (LED) lighting circuit device wherein conductive structures comprise conductive loaded resin-based material.

Referring now to FIG. 1, a first preferred embodiment of the present invention is illustrated. Several important features of the present invention are shown. A lighting circuit 10 device is illustrated. The lighting circuit 10 comprises a light 14 connected to a circuit board 12. The light 14 may comprise any incandescent or solid state light as is known in the art. However, as a preferred embodiment, the light 14 comprises an LED device as shown. The LED device 14 comprises light emitting diode 20 that may be comprise any type of semiconductor material or combinations of materials as are well known in the art. For example, the light emitting diode 20 may comprise silicon, gallium-arsenide (GaAs), Aluminum-Gallium-Arsenide (AlGaAs), Gallium-Nitride (GaN), Indium-Gallium-Nitride (InGaN), or the like. The type of semiconductor and doping materials chosen determines the wavelength(s) of light emitted by the diode.

In this preferred embodiment, the bottom side of the light emitting diode 20 forms the cathode (−), or N-side, while the top side forms the anode (+), P-side. The cathode is connected to a first metal terminal 21 by, for example, solder bonding the bottom side of the light emitting diode 20 directly to the flat of the metal terminal 21. The anode is connected to a second metal terminal 22 by, for example, ultrasonically bonding a gold wire 17 to the top side of the active diode 20. The light emitting diode 20 is encapsulated in a plastic housing 15. The plastic housing 15 provides environmental protection for the active diode 20 and serves to focus the emitted light through the rounded top of the housing 15. To use the LED device 14 in a circuit, the cathode 21 and anode 22 must be connected across a voltage source. In a typical application, the cathode 21 is connected to a ground reference while the anode 22 is connected to a controlled voltage source. In this way, the LED device 14 can be turned ON or OFF based only on the value of the voltage source. For simplicity of illustration, the circuit embodiment 10 shown does not include additional discrete elements, such as integrated circuit devices, resistors, capacitors, or power supplies, that are needed to form a complete lighting circuit 10. However, these components are well known in the art.

In the present invention, the LED device 14 is mechanically and electrically coupled to conductive structures 16a and 16b of conductive loaded resin-based material according to the present invention. In the exemplary case, the conductive loaded resin-based structures 16a, 16b, 16c are formed between a bottom insulating layer 19 and a top insulating layer 18. However, in applications where the conductive structures 16a-c are isolated, such as in a housing, the conductive structures may non-insulated. The conductive loaded resin-based traces 16a, 16b, and 16c may be formed by over-molding the conductive loaded resin-based material onto a bottom insulating layer 19 to form conductive structures 16a-16c onto the insulator 19. Then, a top insulating layer 18 can be molded or coated onto the conductive structures 16a, 16b, and 16c and the bottom insulating layer 19. Alternatively, the conductive loaded resin-based traces 16a, 16b, and 16c may be formed by injection molding and then dip coated or sprayed with an insulating material to form the top and bottom insulating layers 19 and 18. As another preferred embodiment, the conductive loaded resin-based conductive structures 16a, 16b, and 16c comprise the same base resin as the insulating layer 18 and 19 to create optimal inter-layer bonding.

In this embodiment 10, the terminals 21 and 22 of the LED device further comprises vertical leads or pins 21a and 22a for insertion into the conductive structures 16a-16c. Holes are formed in the conductive structures 16a-16c and, if used, through the top insulating layer 18. These holes may be formed during the conductive structures molding process or may be formed by drilling, punching, or stamping after molding. To improve the bonding between the metal leads 21a and 22a and the conductive loaded resin-based structures 16a and 16b, a solderable layer 23 may be formed to line the openings through the conductive loaded resin-based structures 16a and 16b. Once the LED device 14 leads 21a and 22a are inserted into the holes, the connection is completed by soldering the leads 21a and 22a using, for example, a solder wave process. The solderable layer 23, if used, may be formed by plating or by coating. If the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The solderable layer 23 may be formed by, for example, electroplating or physical vapor deposition.

Figure 7:
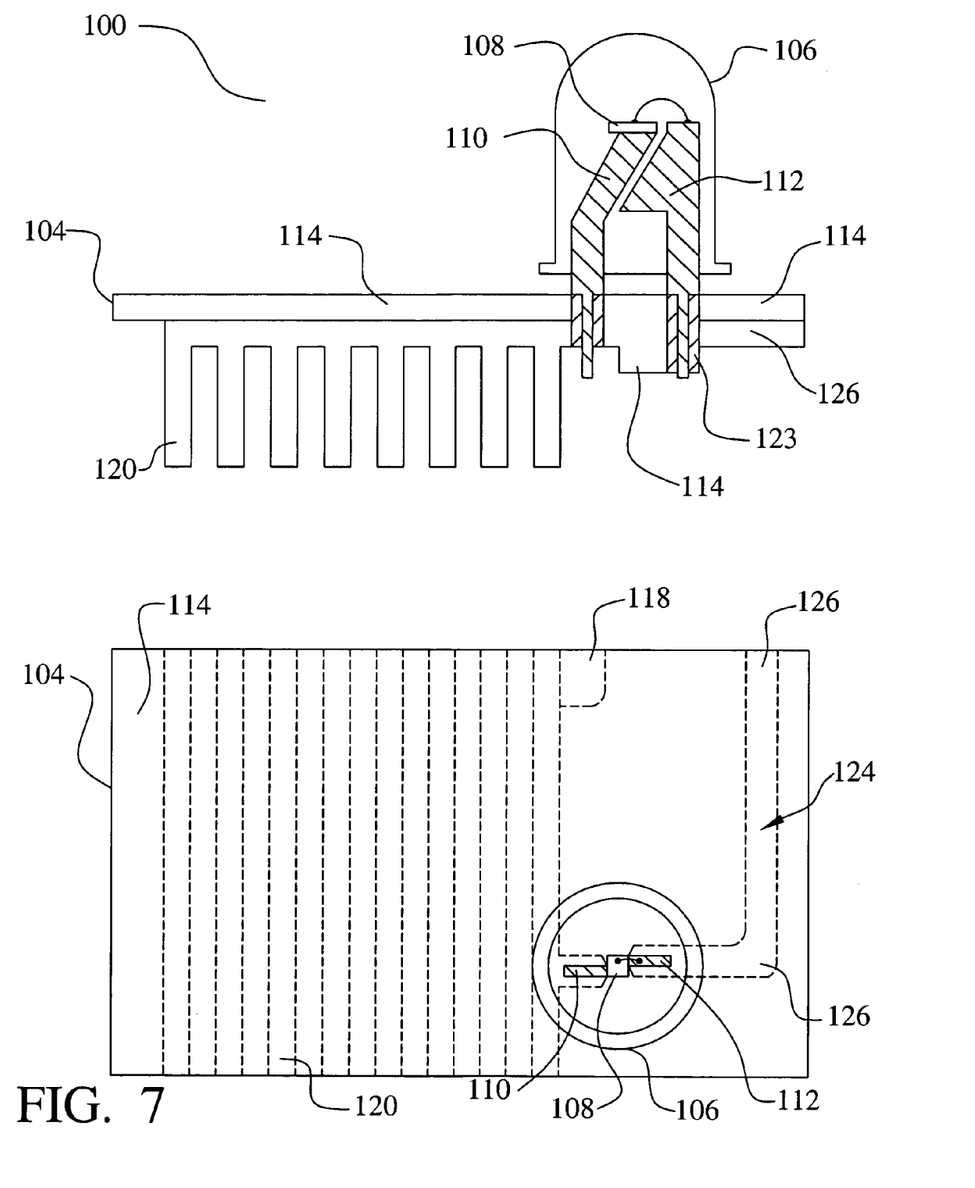
FIG. 7 illustrates a second preferred embodiment of the present invention showing a LED lighting circuit device wherein conductive structures of conductive loaded resin-based material further comprise a resistive damping function and a heat sink function.

The novel lighting circuit 10 incorporates several additional features that provide unique advantages for LED lighting. An resistive damping function may easily be formed in one of the conductive structures. In this embodiment, the conductive structure 16b and 16c that is connected to the anode terminal 22 is arranged such that a resistive damping function 24 is created. That is, a predictable resistance value is formed between the anode terminal 22 and the connection 19 to the power supply, not shown. This resistance value of the resistive damping function is controlled by the relative doping of conductive material in the resin-based host and by the physical layout parameters of cross sectional area and length of the conductive structure 16b and 16c. In this example, an appreciable resistance value is created, even with a low resistivity value conductive loaded resin-based material, by lengthening the anode trace 16b to 16c through a zigzag layout technique. Alternatively, an appreciable resistance value may be created by molding the anode trace from conductive loaded resin-based material that is doped to a higher resistivity. This option is illustrated in FIG. 7 and discussed therein. Referring again to FIG. 1, the ability to integrate a resistive damping function 24 directly into the anode conductive structure 16b-16c facilitates the manufacture of an LED circuit 10 without discrete resistor components. This technique reduces part count, tooling and equipment costs, and assembly time.

As described above, the removal of heat from the active diode device 20 is important for optimal color performance and device lifetime. In the simple LED 14 of the first preferred embodiment, heat is mainly removed via conduction of heat through the cathode terminal 21 that is directly connected to the bottom side of the device 20. This cathode terminal 21 is connected to one of the traces 16a. The excellent thermal conductivity of the conductive loaded resin-based structures 16a-16c provides a path for heat transfer out of the LED device 14. Although the circuit 10 of the first preferred embodiment contains only a single light 14, it is understood that the same approach can easily be extended to include multiple lights on a single board. Further, the signal traces 16a, 16b, and 16c may be designed such that each light is independently controllable or such that lights are all controlled in groupings (all ON or all OFF).

Referring now to FIG. 7, a second preferred embodiment 100 of the present invention is illustrated. Another lighting circuit 100 is shown. In this case, the thermal demands of the application, whether due to a higher temperature environment or due to higher operating currents, make it necessary to add a more definitive heat sink function to the conductive structure 118 connected to the cathode terminal 110. The excellent thermal conductivity of the conductive loaded resin-based material of the present invention allows an excellent heat sink function 120 to integrated into the conductive structure 118 that is connected to the cathode terminal 110. The heat sink function 120 is implemented as a series of fins 121 that substantially increase the ratio of the available convection area to the footprint area of the structure 120. The ability to mold a substantial heat sink function 120 into the conductive structure 118 provides needed thermal transfer capability for the LED device without requiring a discrete heat sink. This capability saves part count, tooling and equipment costs, and assembly time.

As another important feature of this embodiment, the conductive structure 126 connected to the anode terminal 112 of the LED 106 is also formed from conductive loaded resin-based material. However, in this case, the anode conductive structure 126 is formed using higher resistivity conductive loaded resin-based material than the cathode conductive structure 118 having the heat sink function 120. The higher resistivity conductive loaded material 126 is fabricated by reducing the doping, or ratio, of conductive material relative to the base resin. Reducing the conductive material content will increase the resistivity. As a result, a resistive damping function 124 is formed into the molded conductive structure 126 connecting the anode terminal 112 to the power supply, not shown. As an exemplary manufacturing process, the cathode conductive structure 118 with the heat sink function 120 may be injection molded using a lower resistivity conductive loaded resin-based material, the anode conductive structure 126 may be injection molded using a higher resistivity conductive loaded resin-based material 126, and then an insulating layer 114 may be over-molded onto the cathode conductive structure 118 and 120 and the anode conductive structure 126 sub-assemblies to complete a combined circuit board 104. Alternatively, the circuit 100 may be formed without an insulating material. Although the circuit 100 of the second preferred embodiment contains only a single light 106, it is understood that the same approach can easily be extended to include multiple lights on a single board 104. Further, the conductive structures 118 and 126 may be designed such that each light is independently controllable or such that lights are all controlled in groupings (all ON or all OFF). The formation of the conductive structures 118 and 126 of conductive loaded resin-based material reduces material and manufacturing cost and weight when compared to metal-based systems.

Figure 8A:
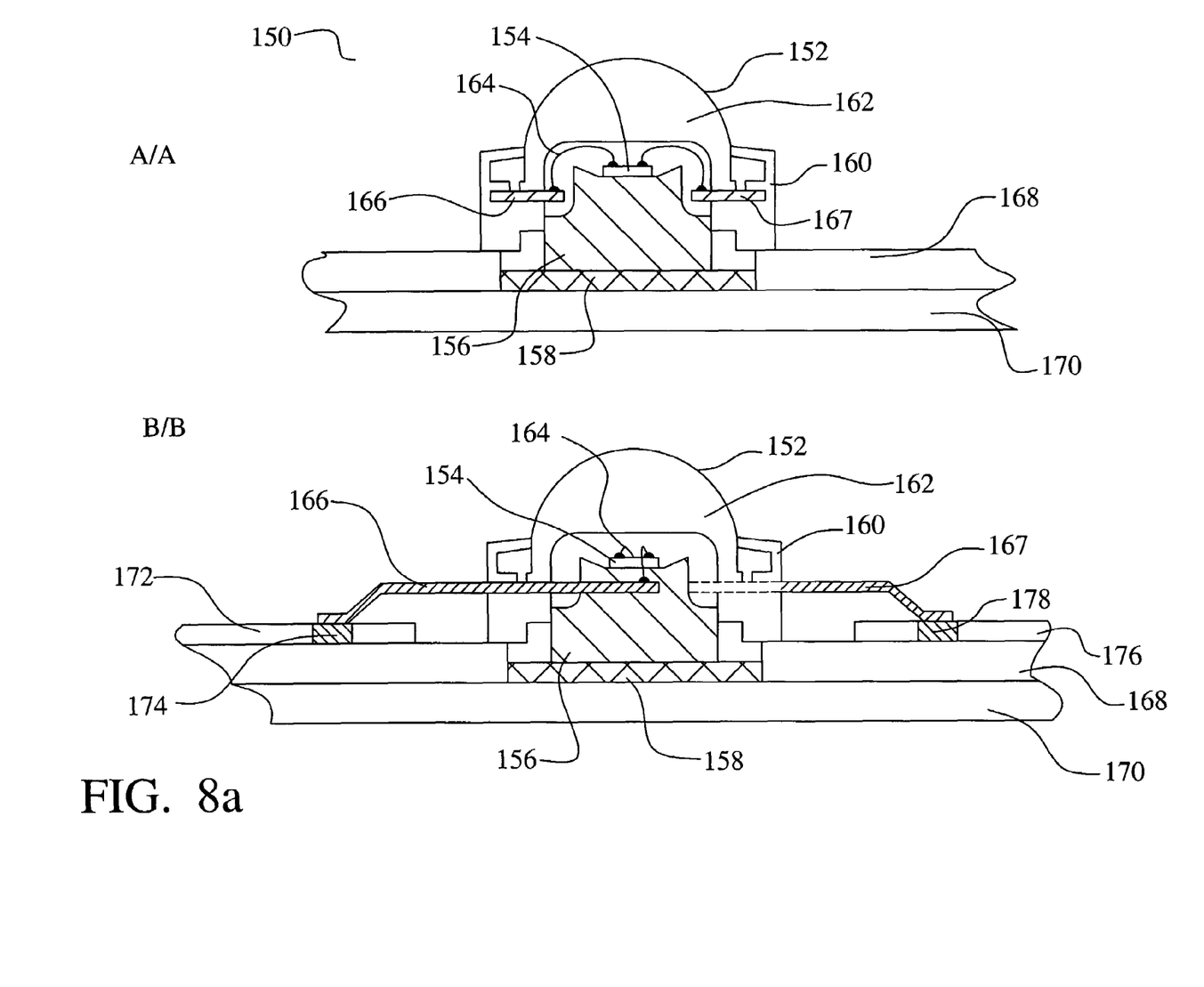
FIGS. 8a and 8b illustrates a third preferred embodiment of the present invention showing an LED lighting circuit device with a high output LED wherein conductive structures of conductive loaded resin-based material further comprise a resistive damping function and a planar heat sink function.
Figure 8B:
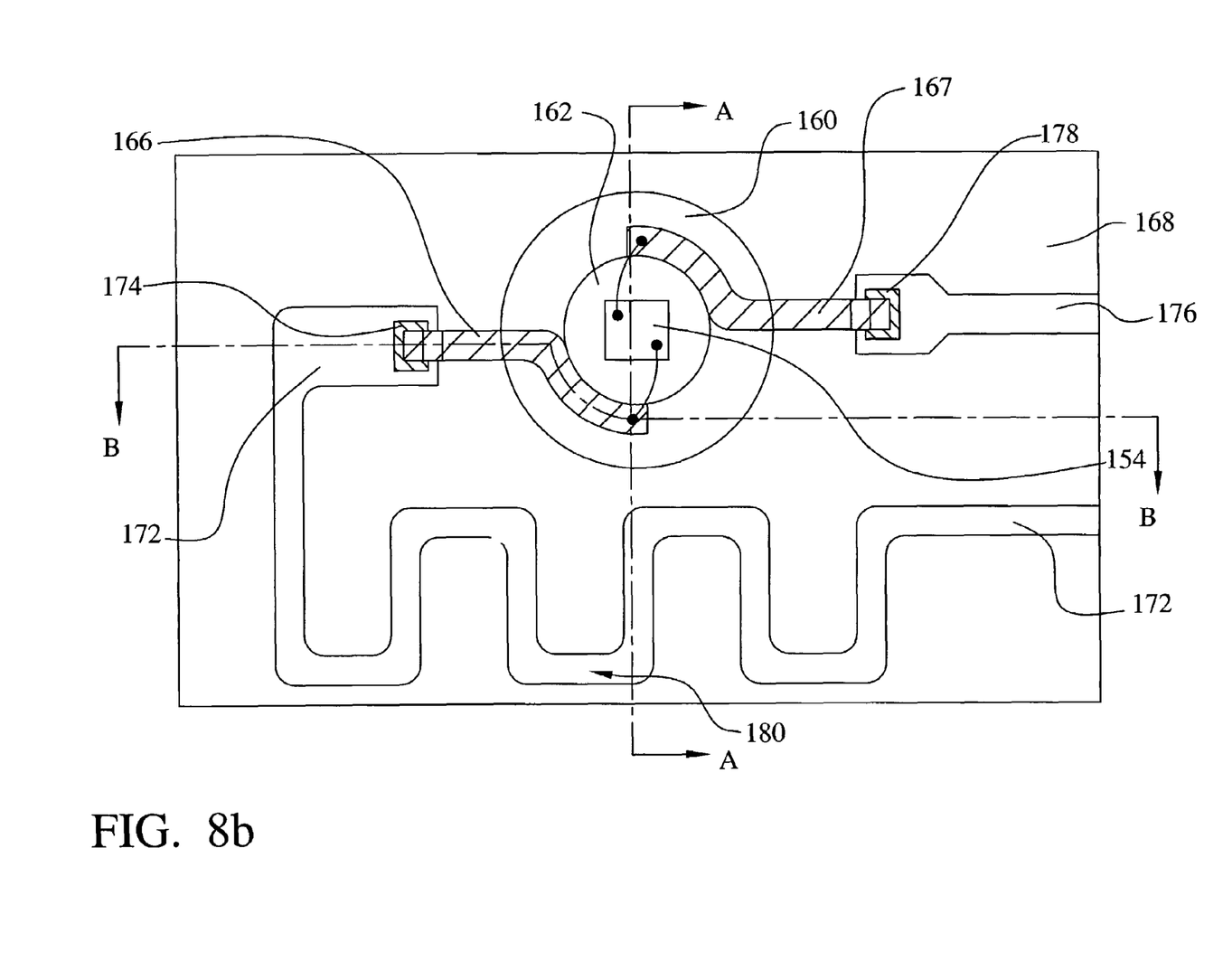

Referring now to FIGS. 8a and 8b, a third preferred embodiment 150 of the present invention is illustrated. In this embodiment 150, the light 152 preferably comprises a high intensity LED device. High intensity LED devices 152 provide substantially more light than the simple LED shown in FIGS. 1 and 7. High intensity LED devices 152 may be any diode color but are more preferably capable of generating a "white" light through the use of a built-in prism or a phosphor layer to convert the emitted light wavelength from the light emitting diode 154 into a multiple wavelength (white) light useful for illumination applications. To achieve higher light intensity (lumens) the LED device is altered in several ways. Most important to the present invention, the electrical and thermal paths are separated. The light emitting diode 154 is contacted only on the top surface by welding gold wires 164 to the anode terminal 166 and to the cathode terminal 167. Meanwhile, the bottom surface of the light emitting diode 154 is thermally attached, using a thermally conductive epoxy or a solder layer, to a metal slug 156. The encapsulating package is then separated into an opaque plastic structure 160 and a transparent lens 162. In an application circuit, the electrical terminals 166 and 167 are connected to the circuit traces while the metal slug 156 may be left unattached or may be thermally connected to a heat sink. The metal slug 156 greatly increases the ability of the LED device 152 to conduct heat away from the light emitting diode 154. In turn, this capability allows the light emitting diode 154 to run at higher currents.

In the present invention, the high intensity LED device 152 is connected to conductive structures 172 and 176 of conductive loaded resin based material according to the present invention. In this case, the conductive loaded resin-based structures 172 and 176 are formed overlying an insulating layer 168. The conductive structures 172 and 176 provide the electrical paths to connect the anode and cathode terminals 166 and 167 to the power source, not shown. As in the previous embodiments, a resistive damping function 180 may be realized in the an anode conductive structure 172 either by a layout technique, as shown, or by forming the anode conductive structures 172 from a higher resistivity conductive loaded resin-based material than is used for the cathode conductive structures 176.

The high intensity LED device 152 uses surface mount leads 166 and 167. To improve the bonding between the conductive loaded resin-based material and the LED leads 166 and 167, solderable structures 174 and 178 may be formed in the conductive loaded resin-based material 172 and 176 according to the present invention. To form the solderable structures 174 and 178, openings are formed in the conductive structures 172 and 176 either by molding the openings into the traces or by a drilling, stamping, or punching operation after molding. A solderable layer 174 and 178 is then formed in the holes by plating and/or a solder wave operation. For example, the solderable layer 174 and 178 may comprise a tin or tin-alloy though other metals can be used. The LED device 152 is attached by soldering the leads 166 and 167 to the solderable layer 174 and 178 using wave solder or a solder reflow operation.

Another important feature of this embodiment is the planar heat sink structure 170 on the bottom side of the circuit board 168. This heat sink structure 170 is formed of conductive loaded resin-based material according to the present invention. An interface layer 158 of, for example, thermally conductive epoxy may be used to thermally couple the metal slug 156 of the LED 152 to the heat sink 170. An opening is made in the insulating layer 168 to facilitate this coupling. The high thermal conductivity of the conductive loaded resin-based heat sink 170 allows heat generated in the active diode 154 to be transferred through the metal slug 156, into the bottom plane heat sink 170, and then dissipated to the environment. The formation of the conductive structure 172 and 176 and the heat sink 170 of conductive loaded resin-based material reduces material and manufacturing cost and weight when compared to metal-based systems. As an exemplary manufacturing sequence, the heat sink plane 170 may be formed by extrusion molding conductive loaded resin-based material. Then, a resin-based insulating layer 168 may be over-molded onto the heat sink 170. Finally, the anode and cathode conductive structures 172 and 176 of conductive loaded resin-based material may be over-molded onto the insulating layer 168. Although the circuit 150 of the third preferred embodiment contains only a single light 152, it is understood that the same approach can easily be extended to include multiple lights on a single board. Further, the conductive structures 172 and 176 may be designed such that each light is independently controllable or such that lights are all controlled in groupings (all ON or all OFF).

Figure 9:
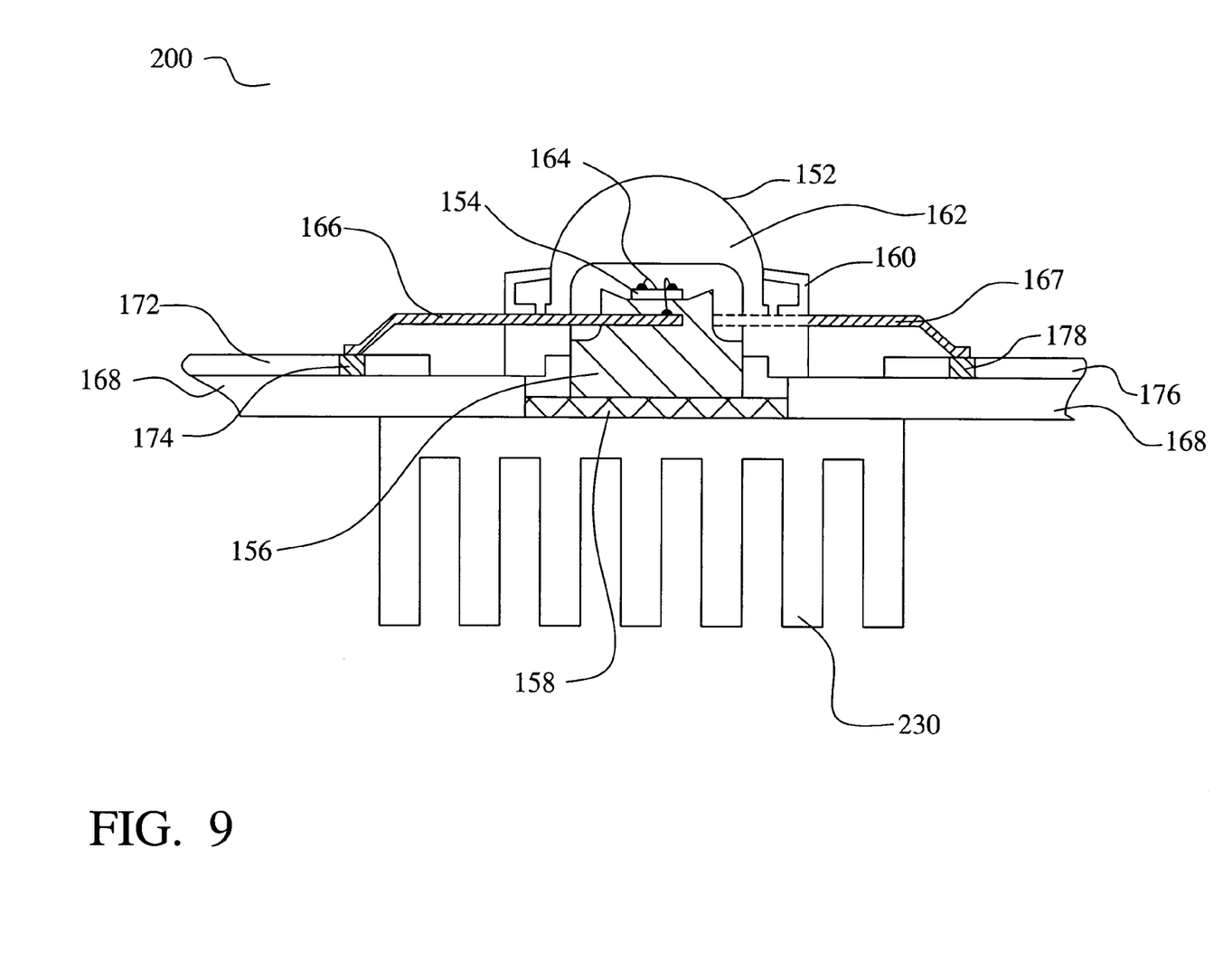
FIG. 9 illustrates a fourth preferred embodiment of the present invention showing an LED lighting circuit device with a high output LED wherein conductive structures of conductive loaded resin-based material further comprise a resistive damping function and a finned heat sink function.

Referring now to FIG. 9, a fourth preferred embodiment 200 of the present invention is illustrated. In this embodiment, the planar heat sink structure of the third embodiment is replaced with a more complex heat sink structure 228 comprising conductive loaded resin-based material according to the invention. The heat sink structure 228 comprises a series of fins 230 or pins or other structural features that increase the ratio of the convection surface area to the footprint area. The heat sink 228 can be injection molded or extruded of the conductive loaded resin-based material. Although the circuit 200 of the fourth preferred embodiment contains only a single light 152, it is understood that the same approach can easily be extended to include multiple lights on a single board. Further, the conductive structures 172 and 176 may be designed such that each light is independently controllable or such that lights are all controlled in groupings (all ON or all OFF).

Figure 10:
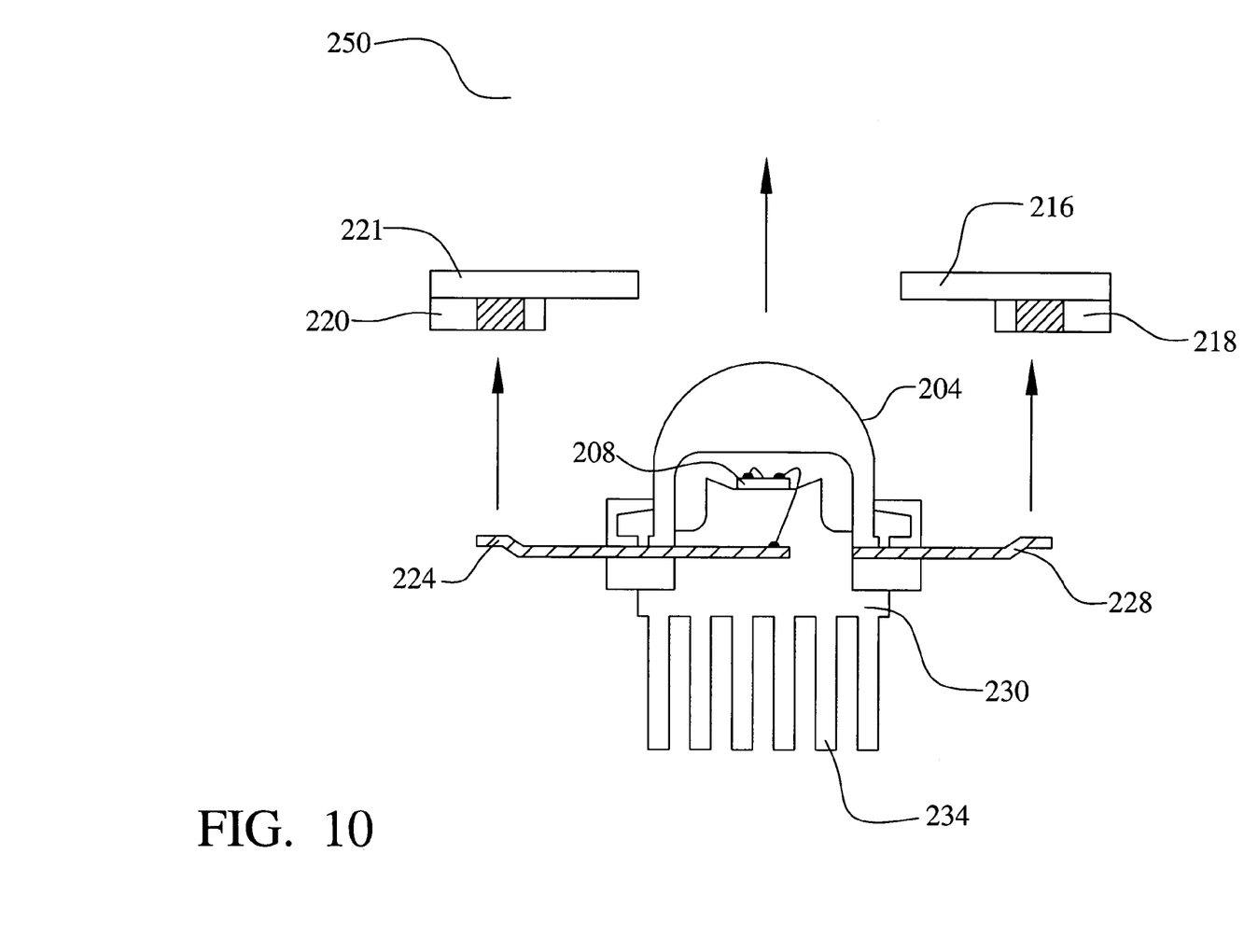
FIG. 10 illustrates a fifth preferred embodiment of the present invention showing a high output LED having a built-in heat sink comprising conductive loaded resin-based material.

Referring now to FIG. 10, a fifth preferred embodiment 250 of the present invention is illustrated. In this embodiment 250, a novel LED device 204 is illustrated where the metal slug and the heat sink structure are combined to form a monolithic heat sink structure 230 of conductive loaded resin-based material according to the invention. The monolithic heat sink 230 may be formed by, for example, extrusion molding or injection molding conductive loaded resin-based material. Then, the monolithic heat sink sub-assembly may be inserted into the LED subassembly, or the LED subassembly may be molded onto the heat sink 230. The conductive loaded resin-based heat sink 230 reduces the weight and material cost of the composite LED device 204, when compared to the separate metal slug and metal heat sink system, while providing a built-in heat sink structure 230 that reduces material and assembly costs for the completed lighting circuit 250. To facilitate a larger heat sink structure 250, the anode and cathode terminals 224 and 228 connected to the active diode 208 are inverted such that they can connect to the bottom of the circuit board 221 while the light 204 protrudes through an opening in the board. The circuit board 221 again preferably comprises conductive loaded conductive structures 220 and 218 with an insulator layer 216. This novel LED device 204 is well suited for single light applications where the additional cost of a heat sink is a considerable cost or for arrays of lights.

Figure 2:
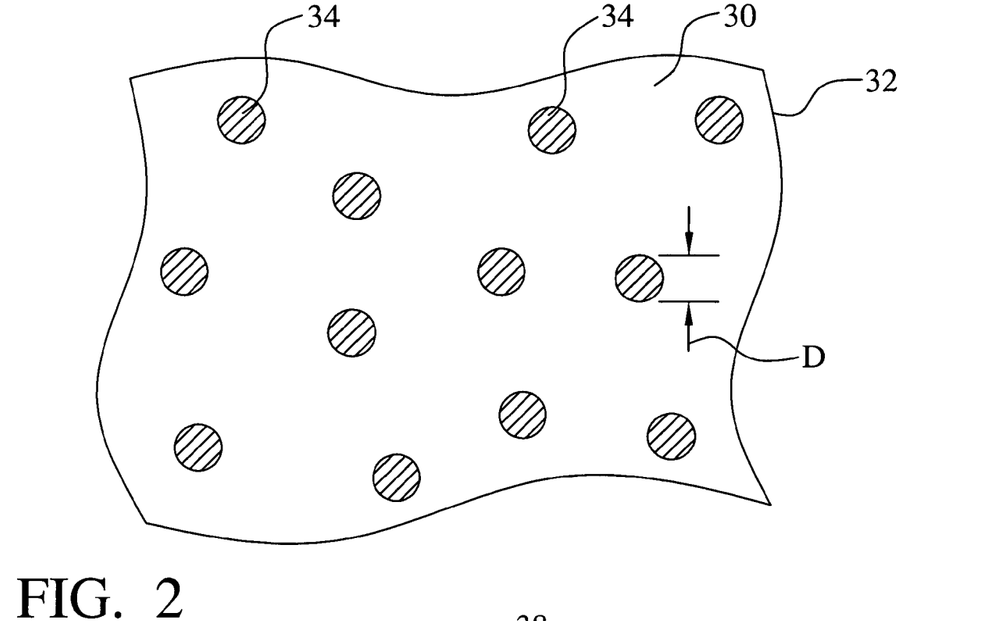
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
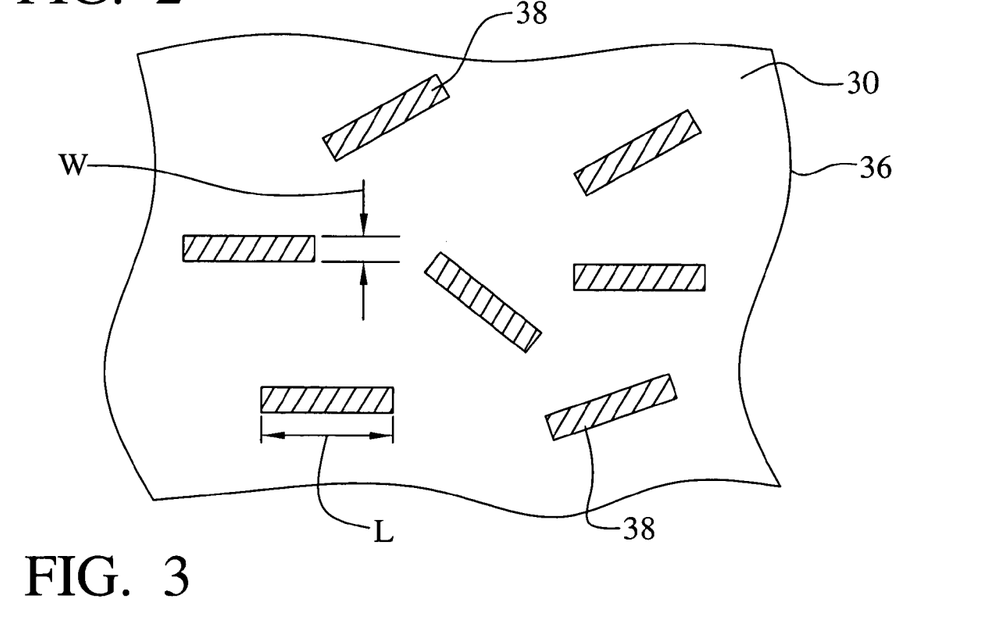
FIG. 3 illustrates a second preferred embodiment of a conductive loaded resin-based material wherein the conductive materials comprise micron conductive fibers.
Figure 4:
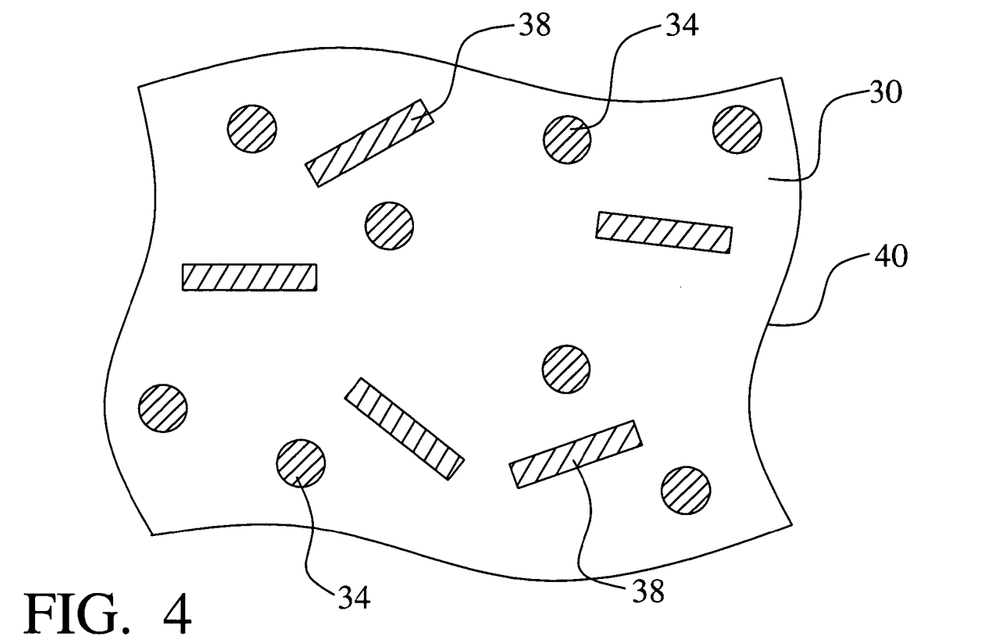
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8-11 micron in diameter and lengths of 4-6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
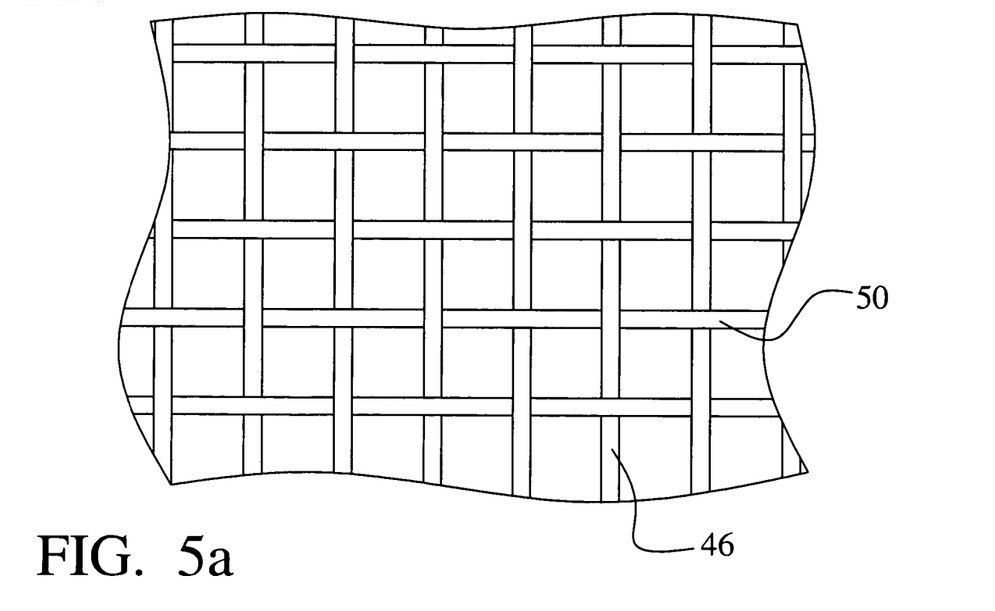
FIGS. 5a and 5b illustrate a fourth preferred embodiment wherein conductive fabric-like materials are formed from the conductive loaded resin-based material.
Figure 5B:
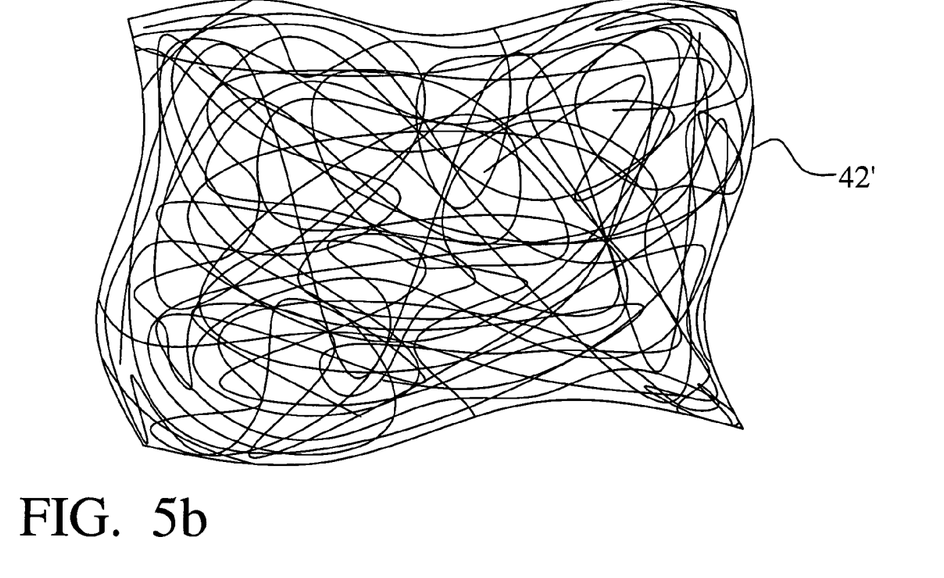

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
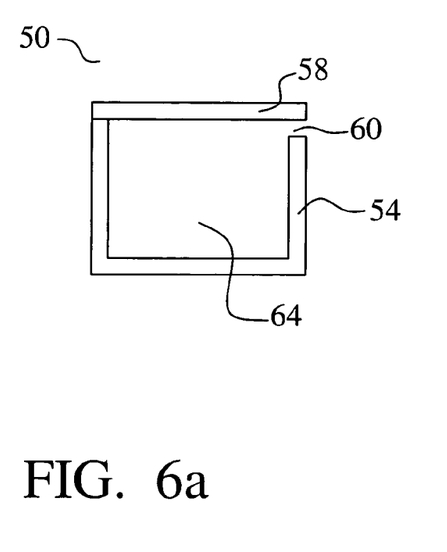
FIGS. 6a and 6b illustrate, in simplified schematic form, an injection molding apparatus and an extrusion molding apparatus that may be used to mold circuit conductors of a conductive loaded resin-based material.

Lighting circuits formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the lighting circuits are removed.

Figure 6B:
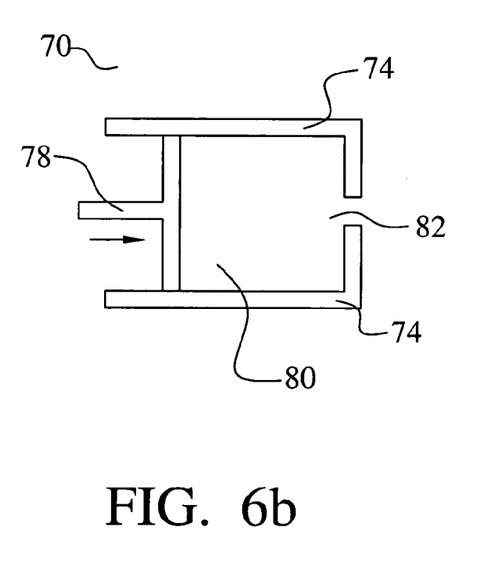

FIG. 6b shows a simplified schematic diagram of an extruder 70 for forming lighting circuits using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. An effective lighting circuit is achieved. A method to form a lighting circuit is achieved. The lighting circuit is molded of conductive loaded resin-based materials. Conductors, resistors, and/or heat sinks are molded of conductive loaded resin-based materials. Methods to fabricate a lighting circuit from a conductive loaded resin-based material incorporate various forms of the material. The lighting circuit is molded of conductive loaded resin-based material has performance characteristics that can be altered or visual characteristics that can be altered through selection of the base resin. The lighting circuit is optimized for an LED lighting source. An LED lighting source with a built-in heat sink comprising a conductive loaded resin-based material is realized. An LED lighting circuit with an integrated resistor in the conductive loaded resin-based traces is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A lighting device comprising:
   a light having electrical terminals; and
   conductive structures connected to said electrical terminals to supply electrical energy to said light wherein said conductive structures comprise a conductive loaded, resin-based material comprising micron conductive materials substantially homogenized in a resin-based material.

2. The device according to claim 1 wherein the ratio, by weight, of said micron conductive materials to said resin host is between about 0.20 and about 0.40.

3. The device according to claim 1 wherein said micron conductive materials comprise metal powder.

4. The device according to claim 3 wherein said metal powder is nickel, copper, or silver.

5. The device according to claim 3 wherein said metal powder is a non-conductive material with a metal plating.

6. The device according to claim 5 wherein said metal plating is nickel, copper, or silver.

7. The device according to claim 3 wherein said metal powder comprises a diameter of between about 3 μm and about 12 μm.

8. The device according to claim 1 wherein said micron conductive materials comprise non-metal powder.

9. The device according to claim 8 wherein said non-metal powder is carbon, graphite, or an amine-based material.

10. The device according to claim 1 wherein said micron conductive materials comprise a combination of metal powder and non-metal powder.

11. The device according to claim 1 wherein said micron conductive materials comprise micron conductive fiber.

12. The device according to claim 11 wherein said micron conductive fiber is nickel plated carbon fiber, stainless steel fiber, copper fiber, silver fiber or combinations thereof.

13. The device according to claim 11 wherein said micron conductive fiber has a diameter of between about 3 μm and about 12 μm and a length of between about 2 mm and about 14 mm.

14. The device according to claim 1 wherein said micron conductive materials comprise a combination of micron conductive powder and micron conductive fiber.

15. The device according to claim 1 wherein at least one said conductive structure additionally provides resistive current damping.

16. The device according to claim 15 wherein doping level of said micron conductive materials in said conductive loaded resin-based material of said resistive current damping conductive structure is different from doping level of said micron conductive materials in said conductive loaded resin-based material of non-resistive current damping conductive structure.

17. The device according to claim 1 wherein at least one said conductive structure additionally provides a heat sink function to dissipate heat from said light.

18. The device according to claim 17 wherein said conductive structure having a heat sink function further comprises fin or pin structures to increase convection surface area.

19. The device according to claim 1 further comprising a heat sink of said conductive loaded resin-based material wherein said heat sink is thermally coupled to said light.

20. The device according to claim 19 wherein said heat sink comprises fin or pin structures to increase convection surface area.

21. The device according to claim 19 wherein said heat sink is molded into said light.

22. The device according to claim 1 wherein said light is a light emitting diode.

23. The device according to claim 1 further comprising a solderable layer in said conductive structures wherein said electrical terminals are soldered to said conductive structures at said solderable layer.

24. The device according to claim 1 further comprising an insulating layer overlying said conductive structures.

25. A method to form a lighting device, said method comprising:
providing a light having electrical terminals;
providing a conductive loaded, resin-based material comprising micron conductive materials substantially homogenized in a resin-based material;
molding said conductive loaded, resin-based material into conductive structures; and
connecting said light electrical terminals to said conductive structures to supply electrical energy to said light.

26. The method according to claim 25 wherein the ratio, by weight, of said micron conductive materials to said resin host is between about 0.20 and about 0.40.

27. The method according to claim 25 wherein the micron conductive materials comprise a conductive powder.

28. The method according to claim 25 wherein said micron conductive materials comprise a micron conductive fiber.

29. The method according to claim 25 wherein said micron conductive materials comprise a combination of micron conductive powder and micron conductive fiber.

30. The method according to claim 25 further comprising forming an electrically insulating layer over said conductive structures.

31. The method according to claim 30 wherein said step of forming an electrically insulating layer comprises dipping, spraying, or coating.

32. The method according to claim 25 wherein said molding comprises:
injecting said conductive loaded, resin-based material into said mold;
molding said conductive loaded resin-based material onto said mounting surface to form conductive structures;
curing said conductive loaded, resin-based material; and
removing said conductive structures from said mold.

33. The method according to claim 25 wherein said molding comprises:
placing a mounting surface in a mold;
injecting said conductive loaded, resinbased material into said mold;
over-molding said conductive loaded resin-based material onto said mounting surface to form conductive structures;
curing said conductive loaded, resin-based material; and
removing said conductive structures and said mounting surface from said mold.

34. The method according to claim 25 wherein said molding comprises:
loading said conductive loaded, resin-based material into a chamber;
extruding said conductive loaded, resin-based material out of said chamber through a shaping outlet; and
curing said conductive loaded, resin-based material to form said conductive structures.

35. The method according to claim 25 further comprising stamping or milling said molded conductive loaded, resin-based material.

* * * * *